(12) United States Patent
Lee

(10) Patent No.: US 11,600,210 B2
(45) Date of Patent: Mar. 7, 2023

(54) IN-CELL TOUCH ORGANIC LIGHT-EMITTING DIODE DISPLAY DEVICE AND TEST METHOD THEREOF

(71) Applicant: LG Display Co., Ltd., Seoul (KR)

(72) Inventor: Se-Yong Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/855,731

(22) Filed: Jun. 30, 2022

(65) Prior Publication Data

US 2022/0335867 A1 Oct. 20, 2022

Related U.S. Application Data

(63) Continuation of application No. 17/127,397, filed on Dec. 18, 2020, now Pat. No. 11,386,821.

(30) Foreign Application Priority Data

Dec. 31, 2019 (KR) .......................... 10-2019-0180108

(51) Int. Cl.
*G09G 3/00* (2006.01)
*H01L 27/32* (2006.01)
*G06F 3/041* (2006.01)
*G06F 3/044* (2006.01)

(52) U.S. Cl.
CPC ............ *G09G 3/006* (2013.01); *G06F 3/044* (2013.01); *G06F 3/0412* (2013.01); *H01L 27/323* (2013.01); *H01L 27/3276* (2013.01)

(58) Field of Classification Search
CPC ............... H01L 27/323; H01L 27/3276; H01L 51/0031; G09G 2330/10; G09G 3/006; G09G 3/3208; G06F 3/044; G06F 3/0445
See application file for complete search history.

(56) References Cited

U.S. PATENT DOCUMENTS

| | | | |
|---|---|---|---|
| 2007/0046322 A1* | 3/2007 | Jeoung | G09G 3/3648 324/760.02 |
| 2015/0200145 A1* | 7/2015 | Yoo | G02F 1/136259 438/158 |
| 2017/0205956 A1 | 7/2017 | Li et al. | |
| 2018/0150162 A1* | 5/2018 | Kim | G06F 11/2221 |

* cited by examiner

*Primary Examiner* — Robin J Mishler
(74) *Attorney, Agent, or Firm* — Morgan, Lewis & Bockius LLP

(57) ABSTRACT

A display device includes a pixel array including touch blocks; a plurality of test pads in a bezel area outside the pixel array for performing a pixel test and a touch block test; a plurality of pixel test lines and a plurality of touch block test lines connected to the test pads within the pixel array; a switching unit between the test pads and the pixel test lines and the touch block test lines and applying a test signal to any one of the pixel test lines and the touch block test lines; a pixel test switching pad in the bezel area and providing a control signal for testing pixel operation in the pixel array to the switching unit; and a touch block test switching pad in the bezel area and providing a control signal for testing the touch blocks within the pixel array to the switching unit.

14 Claims, 9 Drawing Sheets

IN-CELL TOUCH ORGANIC LIGHT-EMITTING DIODE DISPLAY DEVICE AND TEST METHOD THEREOF

The present application is a Continuation of co-pending U.S. patent application Ser. No. 17/127,397, filed on Dec. 18, 2020, which claims the benefit of Korean Patent Application No. 10-2019-0180108, filed Dec. 31, 2019. Each of the above prior U.S. and Korean patent applications is hereby incorporated by reference.

BACKGROUND

Technical Field

The present disclosure relates to an organic light-emitting diode display device and a test method thereof, and more particularly, to a display device and a test method thereof which can realize a narrow bezel by sharing signal application pads for a pixel test and signal application pads for a touch block test.

Discussion of the Related Art

A touchscreen panel is an input device through which an instruction displayed on a screen of an image display device or the like is selected using a user's hand or an object to input a user command. For this, the touchscreen panel may be provided on the front face of an image display device to convert a contact point directly coming into contact with a user's hand or an object into an electrical signal such that an instruction selected at the contact point can be received as an input signal.

The touchscreen panel does not require an additional input device such as a keyboard or a mouse and thus is increasingly used. Recently, a touchscreen panel has been widely used for flat panel displays such as a liquid crystal display and an OLED display device.

As methods for implementing a touchscreen panel, a resistive overlay type, a light sensing type, a capacitive type, and the like are known. Among these, a capacitive type touchscreen panel can convert a contact point into an electrical signal through a conductive detection pattern that detects changes in capacitance formed with another surrounding detection pattern or a ground electrode when a human hand or an object touches the touchscreen panel.

Such a touchscreen panel is manufactured in such a manner that it is attached to the outer face of a flat panel display, in general. However, when a touchscreen panel is attached to the outside face of a flat panel display, that is, when an add-on type touchscreen panel is manufactured, it is necessary to provide an adhesive layer between the touchscreen panel and the flat panel display, resulting in deterioration of optical characteristics. Further, a touchscreen panel manufacturing process is required separately from a flat panel display manufacturing process, and thus manufacturing time and costs increase. Accordingly, to solve such problems, a flat panel display in which a touchscreen panel and a display panel are integrated has recently been developed.

Meanwhile, in a touchscreen panel manufacturing process, a touch detection electrode for detecting touch input is additionally provided to a display element, distinguished from general display elements, and thus a process of testing whether the touch detection electrode has failed as well as a process of testing the display element are performed.

Here, in a panel manufacturing process according to the conventional add-on method in which a touchscreen panel is attached to the outer face of a flat panel display, a step of testing whether a touch detection electrode has failed is performed after a step of forming a final module or a step of manufacturing a touchscreen panel in units of cells in order to determine a touch detection function, in general.

SUMMARY

Accordingly, embodiments of the present disclosure are directed to an in-cell touch organic light-emitting diode display device and a test method thereof that substantially obviate one or more of the problems due to limitations and disadvantages of the related art.

An object of the present disclosure is to provide an in-cell touch OLED display device and a test method thereof which can reduce a space for a bezel for forming lines for testing not only display elements but also electrodes for detecting touch.

Another object of the present disclosure is to provide an in-cell touch OLED display device and a test method thereof which can reduce the number of pads for testing defects of display elements and a plurality of electrodes for detecting touch.

Another object of the present disclosure is to provide an in-cell touch OLED display device and a test method thereof which can increase chamfering efficiency of a glass substrate on which cells are formed.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an in-cell touch organic light-emitting diode (OLED) display device comprises: a pixel array including data lines, gate lines intersecting the data lines, a plurality of pixels corresponding to a plurality of subpixels and arranged in a matrix, and a plurality of touch blocks arranged to respectively correspond to the plurality of pixels; a plurality of test pads arranged in a bezel area outside the pixel array and used to selectively perform a pixel test and a touch block test; a plurality of pixel test lines and a plurality of touch block test lines connected to the plurality of test pads and arranged within the pixel array; a switching unit disposed between the plurality of test pads and the plurality of pixel test lines and the plurality of touch block test lines and applying a test signal to any one of the pixel test lines and the touch block test lines; a pixel test switching pad disposed in the bezel area and providing a control signal for testing pixel operation in the pixel array to the switching unit; and a touch block test switching pad disposed in the bezel area and providing a control signal for testing the touch blocks within the pixel array to the switching unit.

In the in-cell touch OLED display device according to the present disclosure, the plurality of touch block test lines may be arranged in parallel with the pixel test lines.

The in-cell touch OLED display device according to the present disclosure may further include a substrate including driving circuits for driving the pixel array, and the plurality of test pads, the switching unit, the pixel test switching pad and the touch block test switching pad formed in the bezel area.

In the in-cell touch OLED display device according to the present disclosure, a test signal applied to each of the plurality of touch block test lines may be a constant current.

In the in-cell touch OLED display device according to the present disclosure, electrical characteristics of touch blocks measured by the plurality of test pads may include any one of a capacitance value, frequency and resistance voltage of a capacitor formed in the touch block.

In another aspect, a test method of an in-cell touch OLED display device comprises: applying the same test signal to a plurality of pixel test lines connected to a plurality of pixel electrodes arranged in a matrix within a pixel array; detecting information on defects of a pixel to which the test signal is applied; providing a switching signal to a switching unit to connect a plurality of touch block test lines formed in the pixel array to a plurality of test pads formed in a bezel area; applying the same test signal to the touch block test lines; and detecting information on defects of a touch block to which the test signal is applied.

The in-cell touch OLED display device and the test method thereof according to the present disclosure can obtain the following effects.

First, pads for a TFT test and pads for a touch block test can be shared.

Second, a degree of freedom in design can be improved by reducing the number of required test pads.

Third, a bezel size can be reduced to decrease a cell size and chamfering efficiency of a glass substrate can be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
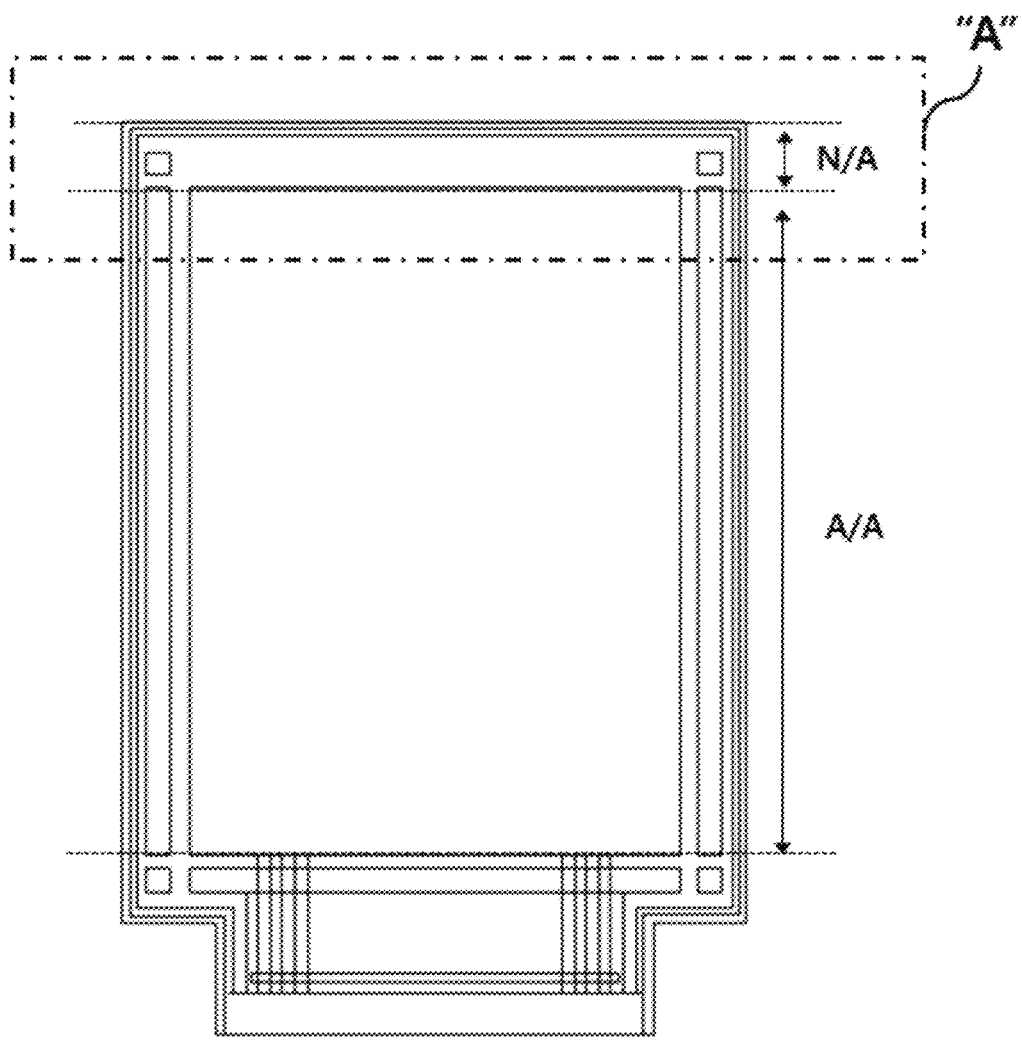
FIG. 1 illustrates an active area and a non-active area of a display device.

For embodiments of the present invention disclosed in the description, specific structural and functional descriptions are exemplified for the purpose of describing embodiments of the present invention, and embodiments of the present invention can be implemented in various forms and are not to be considered as a limitation of the invention.

The present invention can be modified in various manners and have various forms and specific embodiments will be described in detail with reference to the drawings. However, the disclosure should not be construed as limited to the embodiments set forth herein, but on the contrary, the disclosure is to cover all modifications, equivalents, and alternatives falling within the spirit and scope of the embodiments.

While terms, such as "first", "second", etc., may be used to describe various components, such components must not be limited by the above terms. The above terms are used only to distinguish one component from another. For example, a first component may be referred to as a second component and the second component may be referred to as the first component without departing from the scope of the present invention.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements. Other representations for describing a relationship between elements, that is, "between", "immediately between", "in proximity to", "in direct proximity to" and the like should be interpreted in the same manner.

The terms used in the specification of the present invention are merely used in order to describe particular embodiments, and are not intended to limit the scope of the present invention. An element described in the singular form is intended to include a plurality of elements unless the context clearly indicates otherwise. In the specification of the present invention, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Unless otherwise defined, all terms including technical and scientific terms used herein have the same meaning as commonly understood by one of ordinary skill in the art to which example embodiments pertain. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Meanwhile, when a certain embodiment can be implemented in a different manner, a function or an operation specified in a specific block may be performed in a different sequence from that specified in a flowchart. For example, two consecutive blocks may be simultaneously executed or reversely executed according to related function or operation.

Hereinafter, an in-cell touch OLED display device and a test method thereof according to the present invention will be described with reference to the attached drawings.

FIG. 1 illustrates an active area and a non-active area of a display device.

As shown, the display device includes an active area A/A (or pixel area) in which an image is displayed by a plurality of pixel circuits disposed and a non-active area N/A (or bezel area) in which integrated circuits for driving the pixel circuits disposed in the active area A/A, and the like are disposed. The plurality of pixel circuits include a pixel array and a plurality of pixels.

Figure 2:
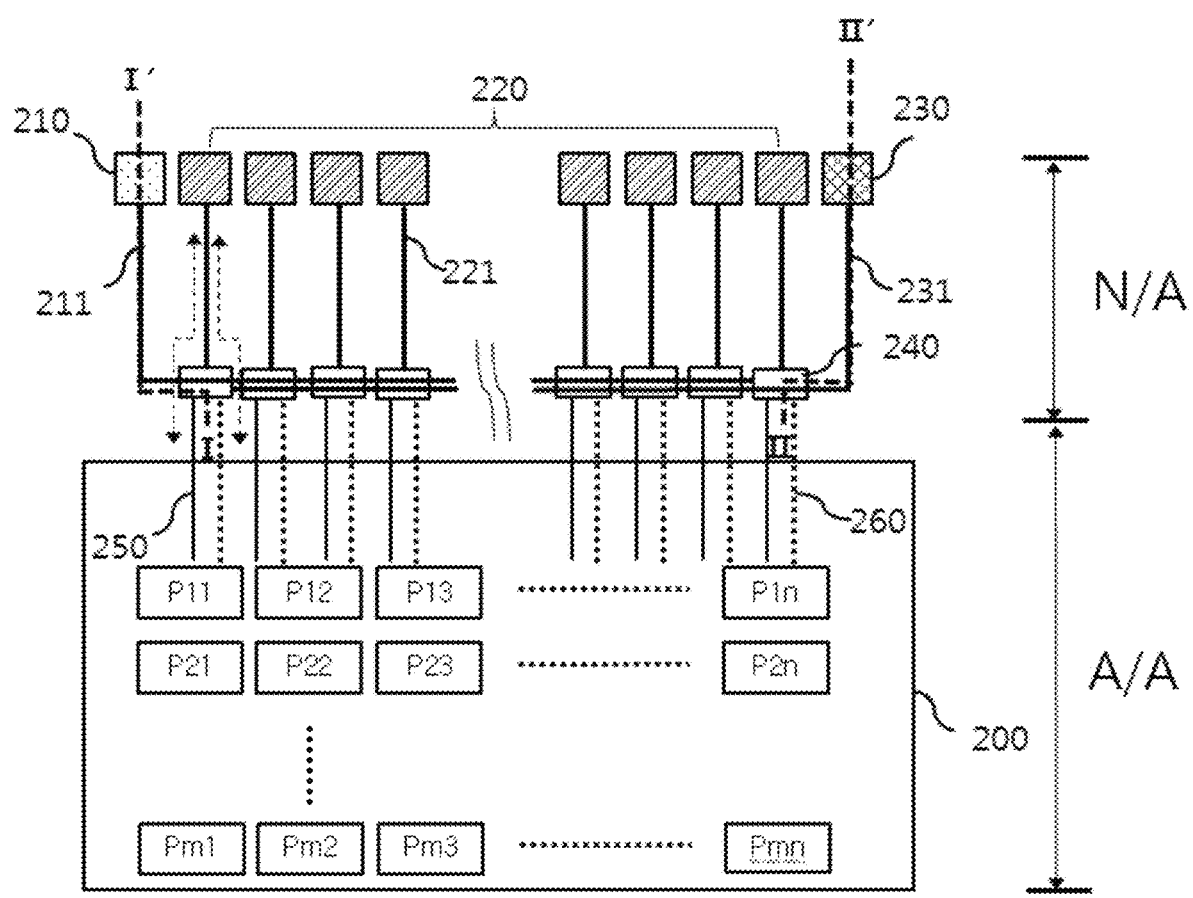
FIG. 2 enlarges "A" of FIG. 1 and illustrates test line arrangement for test of an in-cell touch OLED display device according to the present invention.

FIG. 2 enlarges "A" of FIG. 1 and illustrates test line arrangement for test of an in-cell touch OLED display device according to the present invention.

As shown, the in-cell touch OLED display device according to the present invention includes: a pixel array 200 having data lines, gate lines intersecting the data lines, a plurality of pixels P11 ... Pmn (m, n each is an integer greater than 1) corresponding to a plurality of subpixels and arranged in a matrix, and a plurality of touch blocks disposed to respectively correspond to the plurality of pixels; a plurality of test pads 220 arranged in a bezel area outside the pixel array and used to selectively perform a pixel test and a touch block test; a plurality of pixel test lines 250 and a plurality of touch block test lines 260 connected to the plurality of test pads 220 and arranged in the pixel array; a switching unit 240 which is disposed between the plurality of test pads 220 and the plurality of pixel test lines 250 and touch block test lines 260 and applies a test signal to any one of the pixel test lines and the touch block test lines; a pixel test switching pad 210 which is disposed in the bezel area and provides a control signal for testing pixel operation in the pixel array 200 to the switching unit 240; and a touch block test switching pad 230 which is disposed in the bezel area and provides a control signal for testing touch blocks in the pixel array 200 to the switching unit 240.

The plurality of touch block test lines 260 is arranged in parallel with the pixel test lines 250.

The in-cell touch OLED display device includes a substrate including driving circuits for driving the pixel array 200 and the plurality of test pads 220, the switching unit 240, the pixel test switching pad 210 and the touch block test switching pad 230 formed in the bezel area.

Figure 3:
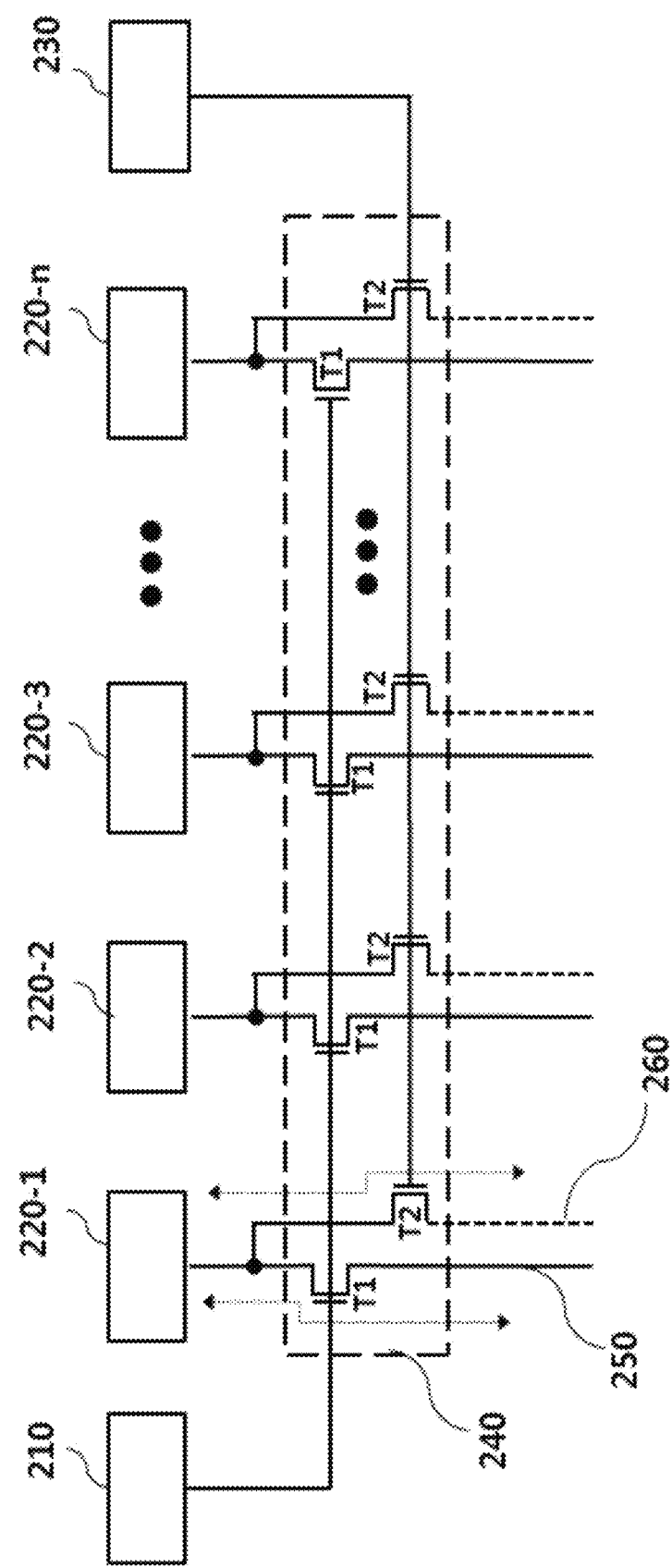
FIG. 3 illustrates arrangement of test pads, a switching unit, a pixel test switching pad and a touch block test switching pad in FIG. 2.

FIG. 3 illustrates arrangement of the test pads 220, the switching unit 240, the pixel test switching pad 210 and the touch block test switching pad 230 in FIG. 2.

As shown, the switching unit 240 includes a plurality of first switching transistors T1 which receives an operation signal provided from the pixel test switching pad 210 through gate electrodes thereof, and a plurality of second switching transistors T2 which receives an operation signal provided from the touch block test switching pad 230 through gate electrodes thereof. When a gate on voltage is supplied to the gate electrodes of the first switching transistors T1 through the pixel test switching pad 210, a gate off voltage is supplied to the gate electrodes of the second switching transistors T2 through the touch block test switching pad 230. When the gate on voltage is supplied to the gate electrodes of the first switching transistors T1 through the pixel test switching pad 210 to turn on the first switching transistors T1, test pads 220-1, 220-2, 220-3, ..., 220-n are connected to the pixel test lines 250. Here, the plurality of second switching transistors T2 is turned off. On the other hand, when the gate on voltage is supplied to the gate electrodes of the plurality of second switching transistors T2 through the touch block test switching pad 230, the plurality of second switching transistors T2 is turned on and thus the test pads 220-1, 220-2, 220-3, ..., 220-n are connected to the touch block test lines 260. Here, the plurality of first switching transistors T1 is turned off.

Figure 4:
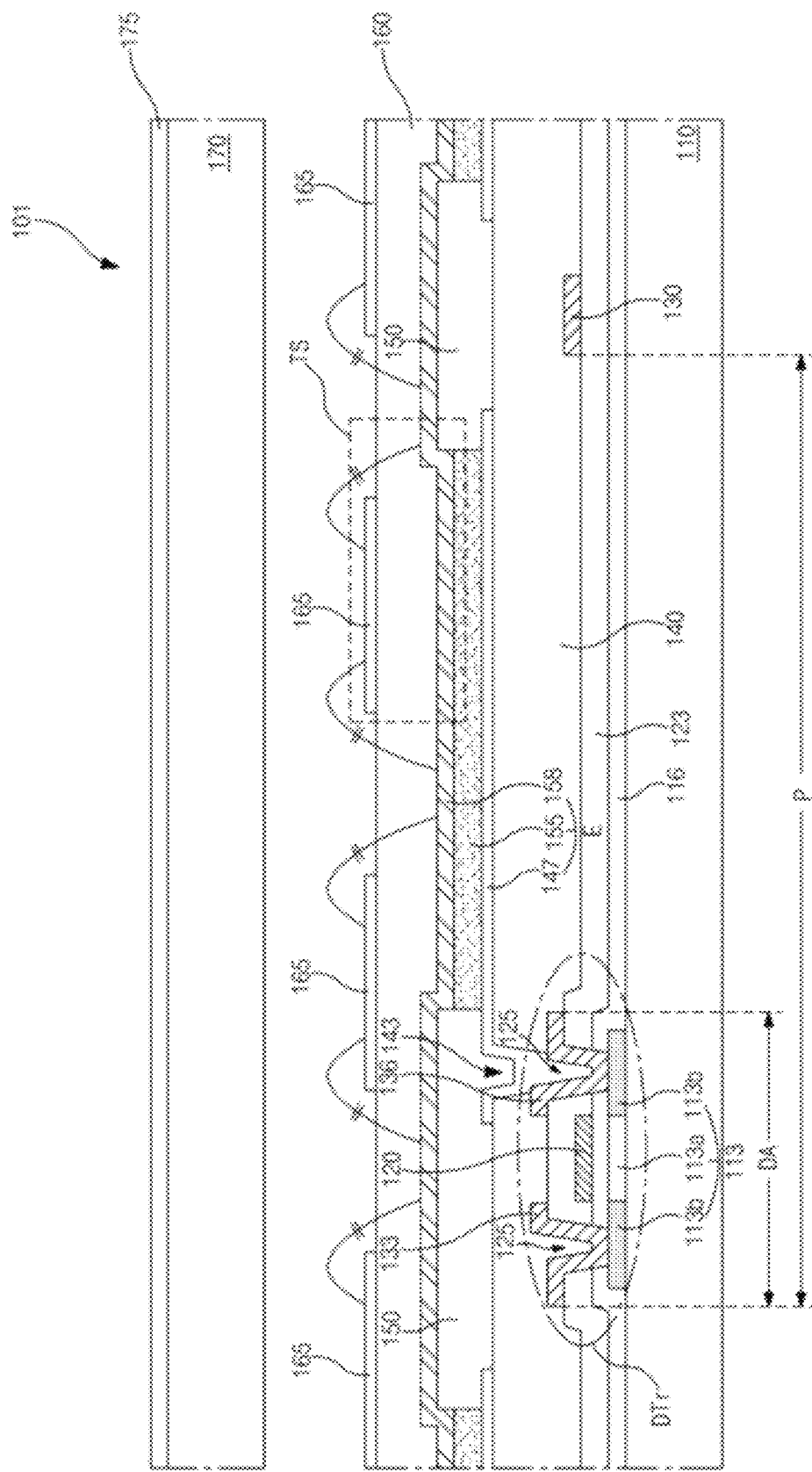
FIG. 4 is a cross-sectional view of a touch sensor in-cell type organic electroluminescent device according to an embodiment of the present invention.

FIG. 4 is a cross-sectional view of a touch sensor in-cell type organic electroluminescent device according to an embodiment of the present invention. Here, an area in which a switching thin film transistor (TFT) will be formed is defined as a switching area and an area in which a driving TFT will be formed is defined as a driving area DA for convenience of description.

As shown, the touch sensor in-cell type organic electroluminescent device 101 according to the present invention includes a first substrate 110 on which a driving TFT DTr, a switching TFT (not shown), an organic light emitting diode (OLED) E, and a touch sensor are formed, and a second substrate 170 for encapsulation. First, a configuration of the first substrate 110 will be described.

A semiconductor layer 113 formed of pure polysilicon and composed of a first region 113a serving as a channel and positioned at the center and second regions 113b positioned on both sides of the first region 113a and doped with impurities in high concentration is formed on the first substrate 110 in each pixel region P. A gate insulating layer 116 is formed on the overall surface of the first substrate 110 to cover the semiconductor layer 113, and a gate electrode 120 corresponding to the first region 113a of the semiconductor layer 113 is formed on the gate insulating layer 116.

Semiconductor contact holes 125 for respectively exposing the second regions 113b positioned on both sides of the first region 113a are formed in an interlayer insulating layer 123 and the gate insulating layer 116 formed thereunder.

Source and drain electrodes 133 and 136 are formed to respectively come into contact with the second regions 113b exposed through the semiconductor contact holes 125. The source and drain electrodes 133 and 136, the semiconductor layer 113 including the second regions 113b in contact with the source and drain electrodes 133 and 136, the gate insulating layer 116 and the gate electrode 120 formed on the semiconductor layer 113 constitute the driving TFT DTr.

A first electrode 147 connected to the drain electrode 136 of the driving TFT DTr serves as an anode or a cathode according to the type of the driving TFT DTr. The first electrode 147 connected to the driving TFT DTr serves as the anode in the present embodiment.

A first passivation layer 140 is formed on the overall surface of the driving TFT DTr. A drain contact hole 143 for exposing the drain electrode 136 of the driving TFT DTr is formed in the first passivation layer 140.

The first electrode 147 connected to the drain electrode 136 of the driving TFT DTr through the drain contact hole 143 is formed on the first passivation layer 140 including the drain contact hole 143 in each pixel region P. A buffer pattern 150 is formed on the first electrode 147 at the boundary of each pixel region P in such a manner that the buffer pattern 150 surrounds each pixel region P while being superposed on the edge of the first electrode 147. In each pixel region P surrounded by the buffer pattern 150, an organic emission layer 155 is formed on the first electrode 147 and a second electrode 158 is formed on the organic emission layer 155 in the entire active area. The first and second electrodes 147 and 158 and the organic emission layer 155 formed therebetween constitute the OLED E.

The second electrode 158 formed on the organic emission layer 155 may be formed of a metal material having a relatively low work function value, for example, one of aluminum (Al), an aluminum alloy (AlNd), silver (Ag), magnesium (Mg), and aluminum magnesium alloy (AlMg), to serve as a cathode.

A second passivation layer 160 is formed of an inorganic insulating material or an organic insulating material on the second electrode 158 formed in the entire active area in order to improve optical efficiency of the organic emission layer 155, protect the second electrode 158 and prevent permeation of moisture.

A touch second electrode 165 in the form of bars spaced at predetermined intervals is formed on the second passivation layer 160. Here, the touch second electrode 165, the second passivation layer 160 positioned under the touch second electrode 165, and the second electrode 158 (touch first electrode) formed in the entire active area constitute a touch sensor TS.

The second electrode 158 is characterized in that it serves as a component of the OLED E and a component of the touch sensor TS.

The second substrate 170 for encapsulation which is formed of a transparent glass material or a transparent plastic material is provided on the touch second electrode 165 having an inert gas, an organic insulating material or a face seal interposed therebetween. A polarizer 175 may be provided on the outside face of the second substrate 170 to improve efficiency of light emitted from the organic emission layer 155.

Meanwhile, in the touch sensor in-cell type organic electroluminescent device 101 having the above-described configuration according to the present invention, the touch sensor TS is configured as a capacitor composed of the second electrode 158, the second passivation layer 160 and the touch second electrode 165. When a finger touches the capacitor, the capacitor recognizes capacitance variation due to fringe field variation thereof and thus serves as a touch sensor TS.

Figure 5A:
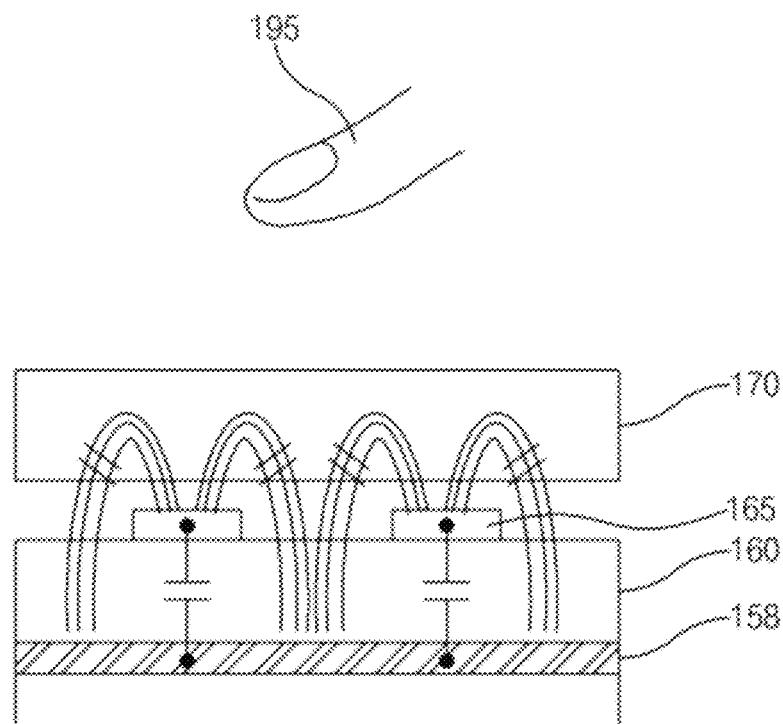
FIGS. 5A and 5B are schematic cross-sectional views for describing operation of a touch sensor in the touch sensor in-cell type organic electroluminescent device.
Figure 5B:
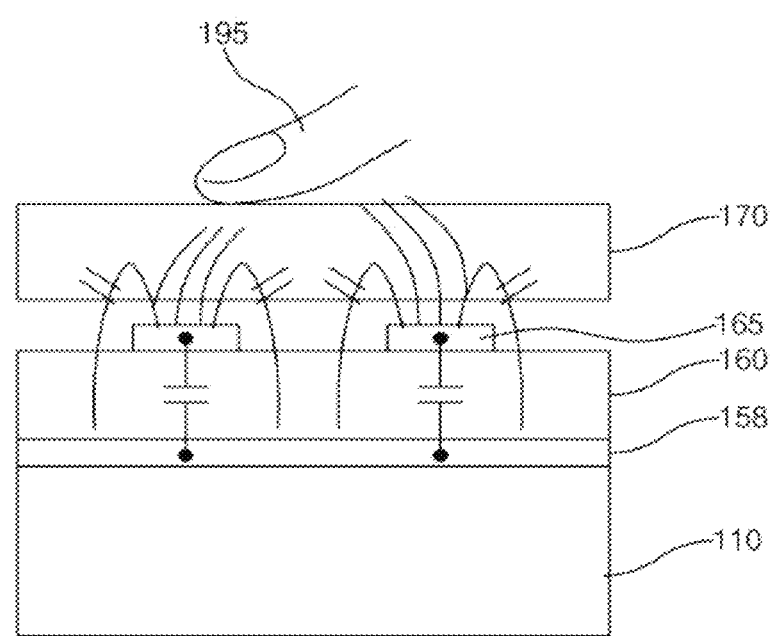

FIGS. 5A and 5B are cross-sectional views for describing operation of the touch sensor in the touch sensor in-cell type organic electroluminescent device according to the present invention. For convenience of description, the driving and switching TFTs and the OLED are omitted and only the touch sensor included in the first substrate and the second substrate for encapsulation are briefly illustrated.

As shown in FIG. 5A, when the surface of the second substrate 170 is not touched by a user's finger 195 in the touch sensor in-cell type organic electroluminescent device 101, a fringe field formed between the second electrode 158 and the touch second electrode 165 is maintained uniform and capacitance does not vary, and thus touch operation is not performed. As shown in FIG. 5B, when the surface of the second substrate 170 is touched by the user's finger 195, the fringe field between the second electrode 158 (touch first electrode) and the touch second electrode 165 varies due to the touching of the finger 195, and thus the touch sensor TS detects the touch and performs touch operation.

Referring to FIG. 4, the touch sensor in-cell type organic electroluminescent device 101 having the above-described configuration according to the present invention is obtained by forming the second electrode 158 that is a component of the OLED E as a touch first electrode of the touch sensor TS, forming the second passivation layer 160 on the second electrode 158 to prevent moisture infiltration as a dielectric layer, separately forming the touch second electrode 165 in the form of spaced bars on the second passivation layer 160, and then attaching the second substrate 170 for encapsulation thereto.

Figure 6A:
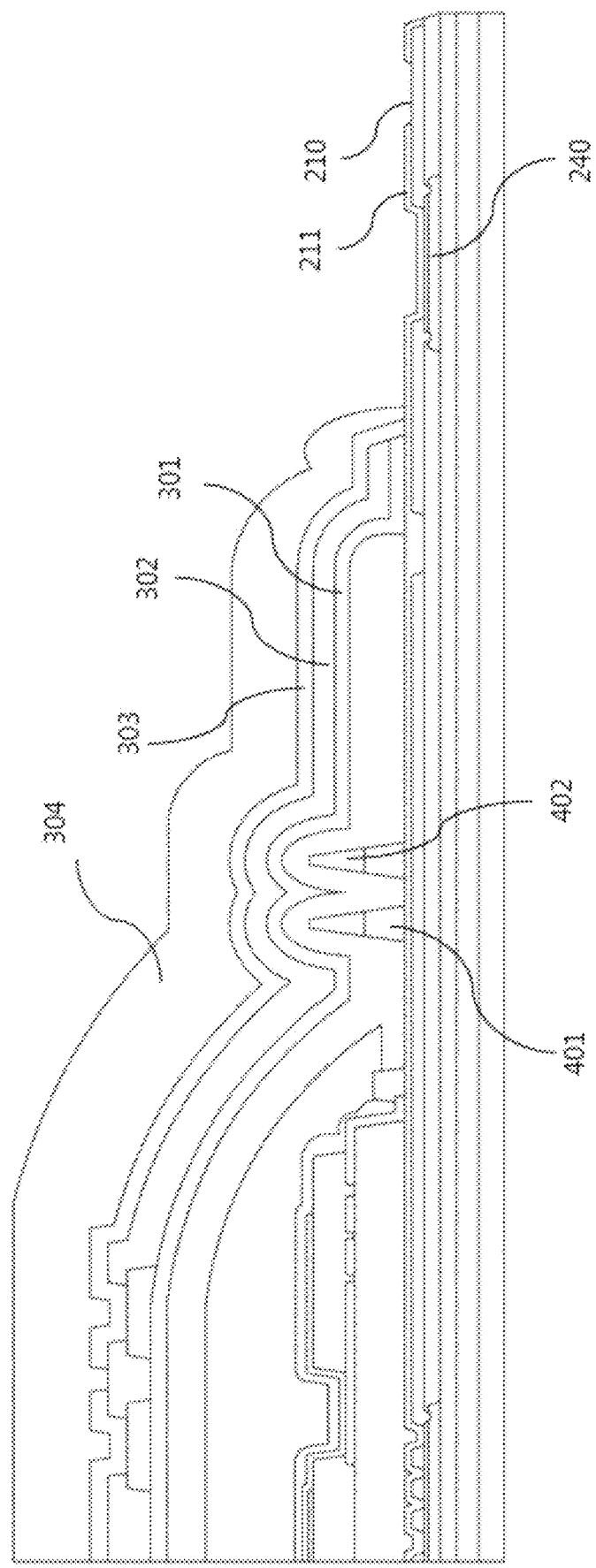
FIG. 6A is a cross-sectional view taken along line I-I' of FIG. 2
Figure 6B:
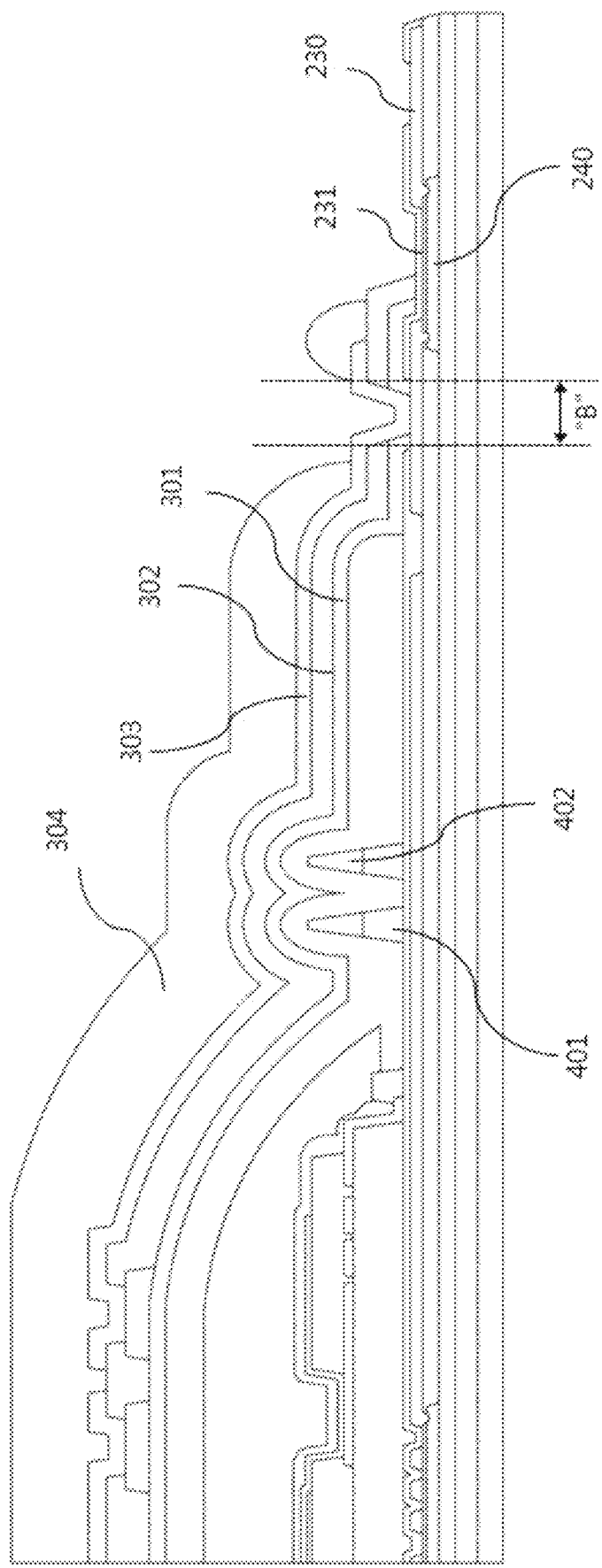
FIG. 6B is a cross-sectional view taken along line II-II' of FIG. 2.

FIG. 6A is a cross-sectional view taken along line I-I' of FIG. 2 and FIG. 6B is a cross-sectional view taken along line II-II' of FIG. 2. As shown in FIG. 6A, a control signal for testing pixel operation in the pixel array 200 is provided to the switching unit 240 through the pixel test switching pad 210 via a pixel test signal transmission line 211. A plurality of switching transistors T1 in the switching unit 240 connects a test pad signal line 221 to the plurality of pixel test lines 250 formed in the pixel array 200.

As shown in FIG. 6B, a control signal for testing touch blocks in the pixel array 200 is provided to the switching unit 240 through the touch block test switching pad 230 via a touch block test signal transmission line 231. A plurality of switching transistors T2 in the switching unit 240 connects the test pad signal line 221 to the plurality of touch block test lines 260 formed in the pixel array 200. A touch area includes a touch metal layer 303 disposed on a touch buffer layer 301, an interlayer insulating layer 302 interposed between the touch buffer layer 301 and the touch metal layer 303, and a passivation layer 304 disposed on the touch metal layer 303. 401 denotes a material being used to be as a bank and 402 denotes a material being used to be a spacer in a peripheral area of the active area. As shown in FIG. 6B, the touch metal layer 303 comes into contact with a source/drain region of a TFT in a region "B".

Figure 7:
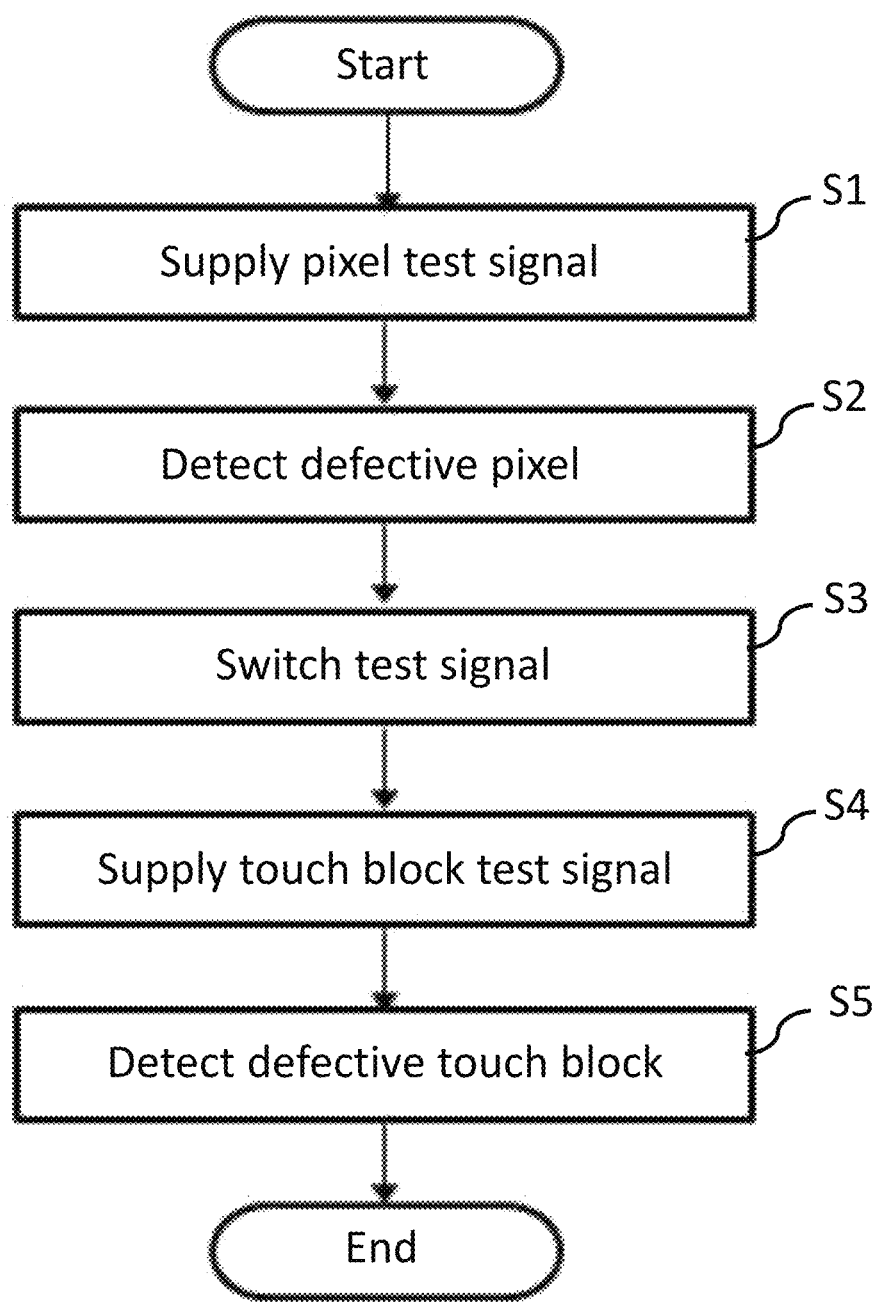
FIG. 7 is a flowchart showing a test method of the in-cell touch OLED display device according to the present invention.

FIG. 7 is a flowchart showing a test method of the in-cell touch OLED display device according to the present invention.

The same pixel test signal is supplied to the plurality of pixel test lines connected to the plurality of pixel electrodes arranged in a matrix in the pixel array. That is, a control signal for testing pixel operation in the pixel array 200 is provided to the switching unit 240 through the pixel test switching pad 210 via the pixel test signal transmission line 211. Accordingly, a switching transistor T1 in the switching unit 240 connects the test pad signal line 221 to the pixel test lines 250 (S1).

The same operating power is supplied to all pixels through all data lines such that all pixels of the pixel array 200 emit light. Here, defective pixels that do not operate although a test signal is applied thereto are detected (S2).

Upon completion of pixel test, a control signal or switching signal for testing touch blocks in the pixel array 200 is provided to the switching unit 240 through the touch block test switching pad 230 via the touch block test signal transmission line 231, i.e., switching test signal. Accordingly, the switching transistor T2 in the switching unit 240 connects the test pad signal line 221 to the plurality of touch block test lines 260 formed in the pixel array (S3).

Accordingly, a constant current is applied to the plurality of touch block test lines from the test pads 220 through the test pad signal line 221, i.e., supplying touch block test signal (S4).

After the test signal is applied to the touch blocks of the pixel array through the touch block test lines, electrical characteristics of the touch blocks are measured through the test pads to detect defects of touch blocks or detect defective touch blocks. Here, the measured electrical characteristics of the touch blocks may include any one of a capacitance value, frequency and resistance voltage of a capacitor formed in the touch blocks (S5).

Figure 8A:
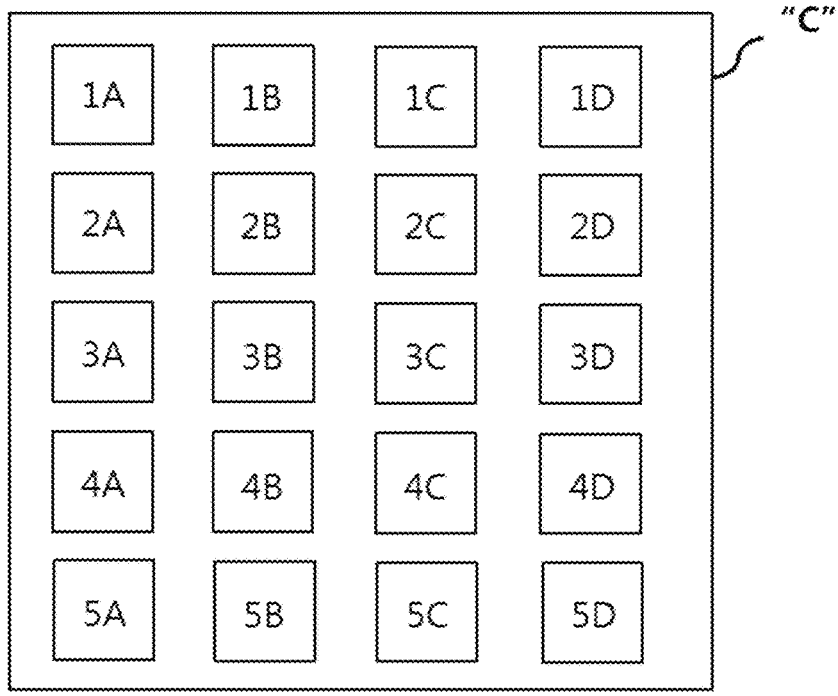
FIG. 8A illustrates a glass substrate of a general in-cell touch OLED display device and FIG. 8B illustrates a glass substrate of the in-cell touch OLED display device according to the present invention.
Figure 8B:
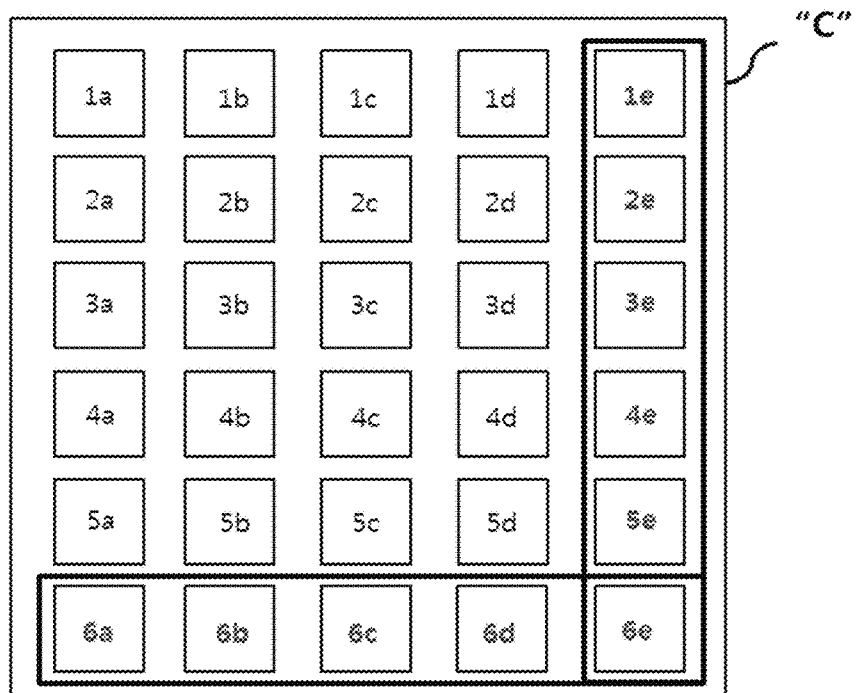

FIG. 8A illustrates a glass substrate of a general in-cell touch OLED display device and FIG. 8B illustrates a glass substrate of the in-cell touch OLED display device according to the present invention.

In a display panel of a general in-cell touch OLED display device, pads for applying a test signal are formed in an area around cells for a test through lighting after the cells are manufactured. Accordingly, a space for forming touch test pads, touch block test lines, pixel test pads and pixel test lines is required in a bezel. Since the size of each cell disposed in a glass substrate C is large, the number of cells that can be formed in a single glass substrate C decreases. Accordingly, the efficiency of the glass substrate forming a panel decreases.

On the other hand, touch test pads for touch block test and pixel test pads can be shared in the in-cell touch OLED display device according to the present invention, and thus the number of required test pads can be reduced and a cell size is not increased. Accordingly, a larger number of cells can be formed in the glass substrate C of the in-cell touch OLED display device according to the present invention.

For example, when the area of the glass substrate is "C", 20 cells (1A to 5D) can be formed on the glass substrate in the case of the conventional in-cell touch OLED display device because the cell size increases, as shown in FIG. 8A.

In the case of the in-cell touch OLED display device according to the present invention, a cell size is not increased and thus 30 cells (1a to 6e) can be formed on the glass substrate C, as shown in FIG. 8B. Accordingly, design efficiency can be improved and manufacturing costs can be reduced.

The features, structures and effects described in the aforementioned example of the present application are included in at least one example of the present application and are not limited to only one example. Furthermore, features, structures and effects exemplified in at least one example of the present application can be combined with other examples or modified by those skilled in the art. Accordingly, it is intended that the present invention cover such combination and modification.

It will be apparent to those skilled in the art that various modifications and variations can be made in the in-cell touch organic light-emitting diode display device and the test method thereof of the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light-emitting diode (OLED) display device, comprising:
   a pixel array including data lines, gate lines intersecting the data lines, a plurality of pixels corresponding to a plurality of subpixels and arranged in a matrix, a plurality of touch blocks arranged on a first passivation layer of the plurality of pixels to respectively correspond to the plurality of pixels and an encapsulation layer on the plurality of touch blocks;
   a plurality of test pads arranged in a bezel area outside the pixel array and used to selectively perform a pixel test and a touch block test;
   a plurality of pixel test lines and a plurality of touch block test lines connected to the plurality of test pads and arranged within the pixel array; and
   a switching unit disposed between the plurality of test pads and the plurality of pixel test lines and the plurality of touch block test lines and applying a test signal to any one of the pixel test lines and the touch block test lines.

2. The OLED display device of claim 1, wherein the plurality of touch block test lines are arranged in parallel with the plurality of pixel test lines.

3. The OLED display device of claim 1, wherein the plurality of test pads comprise:
   a pixel test switching pad disposed in the bezel area and providing a control signal for testing pixel operation in the pixel array to the switching unit; and
   a touch block test switching pad disposed in the bezel area and providing a control signal for testing the touch blocks within the pixel array to the switching unit.

4. The OLED display device of claim 3, further comprising a substrate including driving circuits for driving the pixel array, and the plurality of test pads, the switching unit, the pixel test switching pad and the touch block test switching pad formed in the bezel area.

5. The OLED display device of claim 3, wherein a control signal for testing touch blocks in the pixel is provided to the switching pad through the touch block test switching pad via a touch block test signal transmission line.

6. The OLED display device of claim 3, wherein a touch routing line is disposed at the side of the first passivation layer.

7. The OLED display device of claim 1, wherein a test signal applied to each of the plurality of touch block test lines is a constant current.

8. The OLED display device of claim 1, wherein electrical characteristics of touch blocks measured by the plurality of test pads include any one of a capacitance value, frequency and resistance voltage of a capacitor formed in the touch block.

9. The OLED display device of claim 8, wherein the OLED display device is divided into a pixel area and the bezel area, the pixel array is disposed in the pixel area, wherein an OLED is further provided in the pixel area, and the OLED and the capacitor share one electrode.

10. The OLED display device of claim 9, wherein the other electrode of the capacitor is in a form of spaced bars.

11. The OLED display device of claim 9, wherein the other electrode of the capacitor is formed on the first passivation layer of the plurality of pixels.

12. The OLED display device of claim 9, wherein when a finger touches the capacitor, the capacitor recognizes capacitance variation due to fringe field variation thereof and thus serves as a touch sensor.

13. The OLED display device of claim 1, wherein the touch block comprises;
   a touch buffer layer;
   a touch metal layer on the touch buffer layer;
   an interlayer insulating layer on the touch metal; and
   a second passivation layer disposed on the touch metal layer.

14. The OLED display device of claim 13, wherein the touch metal layer comes into contact with a source/drain of a TFT of the pixel.

* * * * *